(12) United States Patent
Kozlov et al.

(10) Patent No.: US 12,074,577 B2
(45) Date of Patent: Aug. 27, 2024

(54) ACTIVE FILTER

(71) Applicant: Renesas Design Technology Inc., Santa Clara, CA (US)

(72) Inventors: Vladyslav Kozlov, Lviv (UA); Dmytro Mymrikov, Santa Clara, CA (US)

(73) Assignee: Renesas Design Technology Inc., Santa Clara, CA (US)

( * ) Notice: Subject to any disclaimer, the term of this patent is extended or adjusted under 35 U.S.C. 154(b) by 0 days.

(21) Appl. No.: 17/850,359

(22) Filed: Jun. 27, 2022

(65) Prior Publication Data
US 2023/0421133 A1    Dec. 28, 2023

(51) Int. Cl.
*H03H 11/12* (2006.01)
*H03G 5/24* (2006.01)

(52) U.S. Cl.
CPC ............. *H03H 11/126* (2013.01); *H03G 5/24* (2013.01); *H03H 11/1291* (2013.01); *H03H 2210/021* (2013.01)

(58) Field of Classification Search
CPC . H03G 5/24; H03H 11/1291; H03H 2210/021
See application file for complete search history.

(56) References Cited

U.S. PATENT DOCUMENTS

| | | | |
|---|---|---|---|
| 7,005,628 B2 | 2/2006 | Rossi | |
| 7,692,484 B2 | 4/2010 | Terryn et al. | |
| 8,208,883 B2 | 6/2012 | Jeong et al. | |
| 8,519,786 B2 | 8/2013 | Jang et al. | |
| 8,836,423 B2 | 9/2014 | Lavasani | |
| 10,069,479 B1* | 9/2018 | Desclos | H03H 11/1291 |
| 10,224,887 B2 | 3/2019 | Frasch et al. | |
| 2008/0100373 A1* | 5/2008 | Terryn | H03H 11/1291 |
| | | | 327/552 |
| 2015/0002118 A1* | 1/2015 | Pan | H02M 3/07 |
| | | | 323/282 |
| 2019/0238151 A1* | 8/2019 | Wang | H03M 3/32 |

OTHER PUBLICATIONS

Dialog Semiconductor, "Programmable Mixed-Signal Matrix with In-System Programmability and Advanced Analog Features", SLG47004 datasheet, Mar. 2022.
Microchip Technology Inc., "Using Digital Potentiometers to Design Low-Pass Adjustable Filters", AN737 application note, 2004.
Op Amp Gain-bandwidth Product, Learning about Electronics—last accessed on Mar. 24, 2022 at http://www.learningaboutelectronics.com/Articles/Op-amp-gain-bandwidth-product.
Active filter, Wikipedia page—accessed at https://en.wikipedia.org/w/index.php?title=Active_filter&oldid=1014412101.
Sallen-Key topology, Wikipedia page—accessed at https://en.wikipedia.org/w/index.php?title=Sallen%E2%80%93Key_topology&oldid=1026203285.

* cited by examiner

*Primary Examiner* — Sibin Chen
(74) *Attorney, Agent, or Firm* — SCULLY, SCOTT, MURPHY & PRESSER, P.C.

(57) ABSTRACT

An active filter comprising an operational amplifier, and a controller configured to control the bandwidth of the operational amplifier based on a filter cutoff frequency setting and/or a noise performance setting.

17 Claims, 9 Drawing Sheets

ACTIVE FILTER

The present disclosure relates to an active filter. In particular, the present disclosure relates to an active filter comprising an operational amplifier and a controller that, in operation, sets the bandwidth of the operational amplifier based on a setting for the active filter.

BACKGROUND

An active filter is an electronic filter that includes one or more active components, such as an operational amplifier. In operation, the active filter will receive an input signal that is filtered by the active filter in providing an output signal.

Active electronic components consume power during operation, and it is desirable to optimise circuits using active components to avoid wasting power.

SUMMARY

It is desirable to provide an active filter with improved power usage compared with known systems.

According to a first aspect of the disclosure there is provided an active filter comprising an operational amplifier, and a controller configured to control the bandwidth of the operational amplifier based on a filter cutoff frequency setting and/or a noise performance setting.

Optionally, the active filter has a Sallen-Key topology.

Optionally, the active filter comprises tuning circuitry configured to receive the filter cutoff frequency setting and to set the cutoff frequency of the active filter based on the received filter cutoff frequency setting.

Optionally, the tuning circuitry comprises one or more variable resistors, and the resistance of the one or more variable resistors is adjusted based on the received filter cutoff frequency setting, thereby setting the cutoff frequency of the active filter.

Optionally, at least one of the one or more variable resistors comprises a potentiometer or a rheostat.

Optionally, the active filter comprises a filter decoder, wherein the filter cutoff frequency setting is received by the tuning circuitry via the filter decoder, the filter decoder being configured to convert the frequency setting into a suitable format for controlling the tuning circuitry.

Optionally, the controller is configured to control the bandwidth of the operational amplifier by setting its gain bandwidth product.

Optionally, the controller is configured to set the gain bandwidth product of the operational amplifier to a value that is greater than or equal to a gain of the operational amplifier multiplied by the filter cutoff frequency setting, and/or that provides a noise performance of the operational amplifier that is less than the noise performance setting.

Optionally, the noise performance is dependent on one or more of input voltage noise density and RMS noise.

Optionally, the active filter comprises a range decoder wherein the range decoder is configured to receive the filter cutoff frequency setting and/or the noise performance setting, and generate the value to set the gain bandwidth product of the operational amplifier, the value being generated using the filter cutoff frequency setting and/or the noise performance setting.

Optionally, the range decoder is configured to generate the value to set the gain bandwidth product of the operational amplifier by selecting the value from a plurality of gain bandwidth product values.

Optionally, the range decoder is configured to select the minimum value from the gain bandwidth product values that is greater than or equal to the gain of the operational amplifier multiplied by the filter cutoff frequency setting and/or that provides a noise performance of the operational amplifier that is less than the noise performance setting.

Optionally, the range decoder comprises a memory element, the plurality of gain bandwidth product values been stored in the memory element in a look up table format.

Optionally, the controller is configured to control the bandwidth of the operational amplifier based on a gain setting.

Optionally, the active filter comprises tuning circuitry configured to receive the filter cutoff frequency setting and to set the cutoff frequency of the active filter based on the received filter cutoff frequency setting, and/or receive the gain setting and to set the gain of the active filter based on the received gain setting.

Optionally, the tuning circuitry comprises one or more variable resistors, the resistance of the one or more variable resistors is adjusted based on i) the received filter cutoff frequency setting, thereby setting the cutoff frequency of the active filter, and/or ii) the received gain setting, thereby setting the gain of the active filter.

Optionally, at least one of the one or more variable resistors comprises a potentiometer or a rheostat.

Optionally, the active filter comprises a filter decoder, wherein the filter cutoff frequency setting is received by the tuning circuitry via the filter decoder, the filter decoder being configured to convert the frequency setting into a suitable format for controlling the tuning circuitry, and/or a gain decoder, wherein the gain setting is received by the tuning circuitry via the gain decoder, the gain decoder being configured to converter the gain setting into a suitable format for controlling the tuning circuitry.

Optionally, the controller is configured to control the bandwidth of the operational amplifier by setting its gain bandwidth product.

Optionally, the controller is configured to set the gain bandwidth product of the operational amplifier to a value that is greater than or equal to the gain setting multiplied by the filter cutoff frequency setting and/or that provides a noise performance of the operational amplifier that is less than the noise performance setting.

Optionally, the noise performance is dependent on one or more of input voltage noise density and RMS noise.

Optionally, the active filter comprises a range decoder wherein the range decoder is configured to receive the gain setting, receive the filter cutoff frequency setting and/or the noise performance setting, and generate the value to set the gain bandwidth product of the operational amplifier, the value being generated using the gain setting and one or both of the filter cutoff frequency setting and the noise performance setting.

Optionally, the range decoder is configured to generate the value to set the gain bandwidth product of the operational amplifier by selecting the value from a plurality of gain bandwidth product values.

Optionally, the range decoder is configured to select the minimum value from the gain bandwidth product values that is greater than or equal to the gain setting multiplied by the filter cutoff frequency setting and/or that provides a noise performance of the operational amplifier that is less than the noise performance setting.

Optionally, the range decoder comprises a memory element, the plurality of gain bandwidth product values been stored in the memory element in a look up table format.

According to a second aspect of the disclosure there is provided a method of controlling an active filter comprising an operational amplifier, the method comprising controlling the bandwidth of the operational amplifier based on a filter cutoff frequency setting and/or a noise performance setting, using a controller.

It will be appreciated that the method of the second aspect may include providing and/or using features set out in the first aspect and can incorporate other features as described herein.

According to a third aspect of the disclosure there is provided an apparatus being an amplifier or an analog to digital converter, the apparatus comprising an active filter comprising an operational amplifier, and a controller configured to control the bandwidth of the operational amplifier based on a filter cutoff frequency setting and/or a noise performance setting.

Optionally, the amplifier is programmable gain amplifier (PGA) or an analog to digital converter driver.

Optionally, the apparatus is an analog to digital converter configured i) to operate in a high performance mode when the noise performance setting is less than a threshold value, and/or ii) to operate in a low power mode when the noise performance setting is greater than or equal to a threshold value.

It will be appreciated that the apparatus of the third aspect may include providing and/or using features set out in the first aspect and/or second aspect and can incorporate other features as described herein.

According to a fourth aspect of the disclosure there is provided a method of providing an analog to digital converter comprising an active filter comprising an operational amplifier, and a controller configured to control the bandwidth of the operational amplifier based on a filter cutoff frequency setting and/or a noise performance setting.

It will be appreciated that the method of the fourth aspect may include providing and/or using features set out in the third aspect and can incorporate other features as described herein.

BRIEF DESCRIPTION OF THE DRAWINGS

The disclosure is described in further detail below by way of example and with reference to the accompanying drawings in which.

DETAILED DESCRIPTION

Figure 1A:
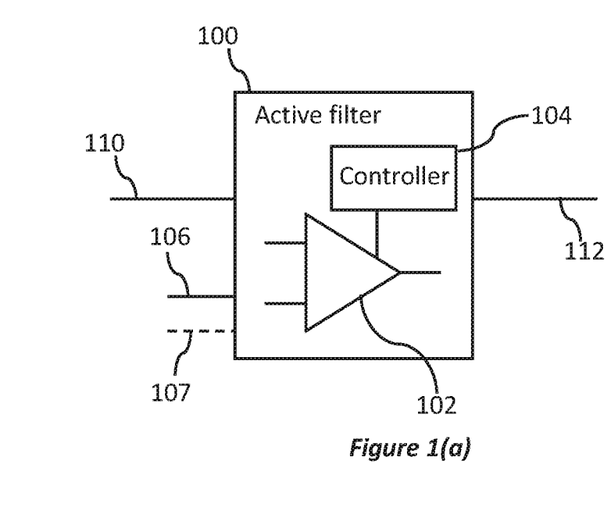
FIG. 1(a) is a schematic in accordance with a first embodiment of the present disclosure.

FIG. 1(a) is a schematic of an active filter 100 comprising an operational amplifier 102 and a controller 104 in accordance with a first embodiment of the present disclosure. The controller 104 is configured to control the bandwidth of the operational amplifier 102 based on a circuit setting 106, where the circuit setting 106 is a filter cutoff frequency setting or a noise performance setting for the active filter 100.

In a further embodiment, the controller 104 may be configured to control the bandwidth of the operational amplifier 102 based on the circuit setting 106 and a circuit setting 107, where the circuit setting 107 is the other of the cut of frequency setting and the noise performance setting.

In summary, the control "sets" the bandwidth of the operational amplifier 102 based on one or more settings that are to be applied, or have been applied, to the active filter 100.

Figure 1B:
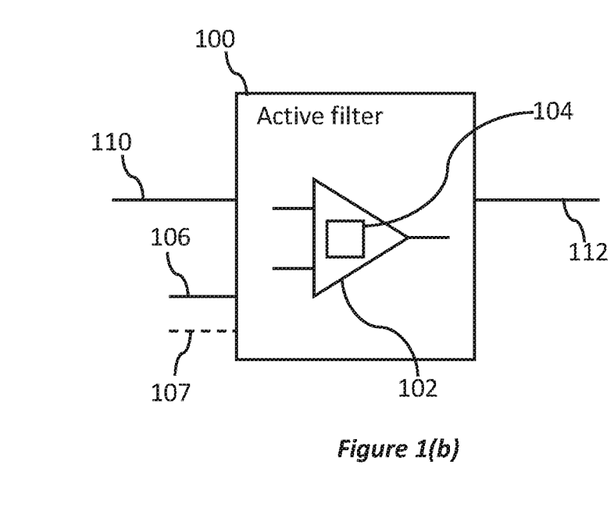
FIG. 1(b) is a schematic of the active filter illustrating an alternative embodiment of the filter of FIG. 1(a)

FIG. 1(b) is a schematic of the active filter 100 illustrating an alternative embodiment of the filter 100 of FIG. 1(a), where the operational amplifier 102 comprises the controller 104. It will be appreciated that the controller 104 may be provided as part of the operational amplifier 102 or separate from the operational amplifier 102 in any of the embodiments described herein.

The active filter 100 received an input signal 110 which is processed by the active filter to provide an output signal 112 which is a "filtered" version of the input signal 110.

Typically, in operation, an active filter will permit passage of certain frequencies, whilst restricting others. Furthermore, the active filter may apply a "gain" thereby amplifying certain frequencies whilst attenuating others.

For example, in an embodiment where the active filter 100 is configured to function as a low pass filter, frequency components of the input signal 110 below a cutoff frequency may be passed to an output of the active filter 100 with little or no attenuation and be provided as part of the output signal 112. Frequencies components of the input signal 110 beyond the cutoff frequency will be attenuated. In some embodiments, where a gain that is greater than unity is applied, components of the input signal 110 may be amplified in providing the output signal 112.

The filter cutoff frequency setting is used to set the cutoff frequency of the active filter 100. The cutoff frequency is a well-known term in the technical field and refers to a frequency above which, or below which, a signal begins to be attenuated. The cutoff frequency may also be referred to as the corner frequency.

The cutoff frequency of the filter is the common engineering term that in most cases means the frequency at which the signal is reduced by −3 dB or (0.7). For example, in the case of low-pass filter with the cutoff frequency 1 MHz, this means that the AC signal with the amplitude of 1V will be reduced to 0.7V at the output at 1 MHz frequency.

The noise performance setting is used to adjust the noise performance of the active filter 100. For example, certain applications may permit more noise than others, meaning that the active filter 100 may be operated in a lower power mode than otherwise. Whereas, other applications may require low noise, with a higher power mode providing a reduction in noise. Adjustment of noise performance to accommodate different use cases can be used to optimise power consumption by reducing power when it is not needed.

If the noise performance of the filter 100 must be improved, the gain-bandwidth product of the opamp 102 can be increased based on the following assumption: the higher bandwidth, the lower the opamp 102 noise.

An embodiment where both the filter cutoff frequency setting and the noise performance setting are used to control the bandwidth of the operational amplifier 102 can be used to further optimise power usage when compared with an embodiment using only one of these settings for bandwidth control of the operational amplifier 102.

Electrical noise is a well-known term in the field and can refer to, generally unwanted, fluctuations in signals.

The filter cutoff frequency setting and/or the noise performance setting may, for example, be set by a user, or may be controlled by a circuit (which may be part of or separate from the active filter 100) during normal operation. As a rule, it is uncontrollable The controller 104 may be configured to control the bandwidth of the operational amplifier 102 by setting the gain bandwidth product of the operational amplifier 102. For example, the controller 104 may be configured to control the bandwidth of the operational amplifier 102 by switching between discrete settings of the gain bandwidth product of the operational amplifier 102.

The gain bandwidth product of the operational amplifier 102 is the product of the gain and the bandwidth of the operational amplifier at a given frequency. A gain bandwidth product of an opamp can be controlled by increasing the internal bias current of the opamp. As a rule, increasing the bias current leads to a faster recharge of the capacitance. Thus, a higher bandwidth of the operational amplifiers can be achieved.

The gain-bandwidth product GBW of the opamp or the bandwidth setting of the opamp is the parameter that can be used to define the max input signal frequency the opamp can operate with. The gain-bandwidth can be calculated as a gain of the opamp multiplied by bandwidth.

For example, in the case of opamp with a 10 MHz gain-bandwidth product and the gain of the opamp G=5, the opamp can operate with 2 MHz max signal frequency. All signals with frequency higher than 2 MHz will be attenuated and opamp will operate as a low-pass filter for frequencies higher than 2 MHz. If the gain of the same opamp is G=1, the opamp can operate with frequencies up to 10 MHz.

In a specific embodiment where the controller 104 is configured to control the bandwidth of the operational amplifier 102 based on the filter cutoff frequency setting, the controller 104 may be configured to set the gain bandwidth product to a value $GBW_{set}$ that is greater than or equal to a gain Gain of the operational amplifier 102 multiplied by the filter cutoff frequency setting $f\_cutoff_{set}$. This condition may be represented by the following equation:

$$\frac{GBW_{set}}{Gain} \geq f\_cutoff_{set} \quad (1)$$

Generally, the lower gain bandwidth product of the op amp, the lower the current consumption. The condition of equation (1) enables a significant reduction in current consumption when applied to applications using tuneable active filters.

The power consumption of the active filter 100 will be changed significantly depending on the cutoff frequency of the filter 100. The lower the cutoff frequency, the lower power consumption.

Consider an example, where the cutoff frequency range of the analog filter 100 is 1 MHz to 8 MHz. When operating with an 8 MHz filter setting ($f\_cutoff_{set}$), the opamp gain-bandwidth product setting ($GBW_{set}$) should be >8 MHz (in case of 1 V/V Gain of the filter 100). When operating with a 1 MHz filter setting ($f\_cutoff_{set}$), the opamp bandwidth of >8 MHz is redundant and can be reduced. Eventually, the current consumed by the analog filter at the 1 MHz filter cutoff frequency setting will be much lower than the current consumed at 8 MHz, if the opamp bandwidth was changed accordingly using the above method.

In a further embodiment where the controller 104 is configured to control the bandwidth of the operational amplifier 102 based on the noise performance setting, the controller 104 may be configured to set the gain bandwidth product to a value $GBW_{set}$ that provides a noise performance noise($GBW_{set}$) of the operational amplifier 102 that is less than the noise performance setting $noise_{set}$. This condition may be represented by the following equation:

$$\text{noise}(GBW_{set}) < \text{noise}_{set} \quad (2)$$

The noise performance may, for example, be defined based on input voltage noise density and/or an RMS noise.

For example, it may be desirable to have the operational amplifier 102 exhibit an RMS noise that is below a threshold value for a given application. By providing a noise performance setting $noise_{set}$ that defines this threshold value, the gain bandwidth product can be set to a value that provides a noise performance that is below the required RMS noise level.

In summary, noise($GBW_{set}$) is the noise characteristic of opamp 102 at the selected gain-bandwidth product setting, for example, input voltage noise density or RMS noise. The $noise_{set}$ may be the minimum allowable noise level of the opamp 102 (for example, the minimum allowable input voltage noise density of the opamp or RMS noise).

In a further embodiment where the controller 104 is configured to control the bandwidth of the operational amplifier 102 based on the filter cutoff frequency setting and the noise performance setting, the controller 104 may be configured to set the gain bandwidth product to a value that meets both conditions as provided by equations (1) and (2).

Figure 2A:
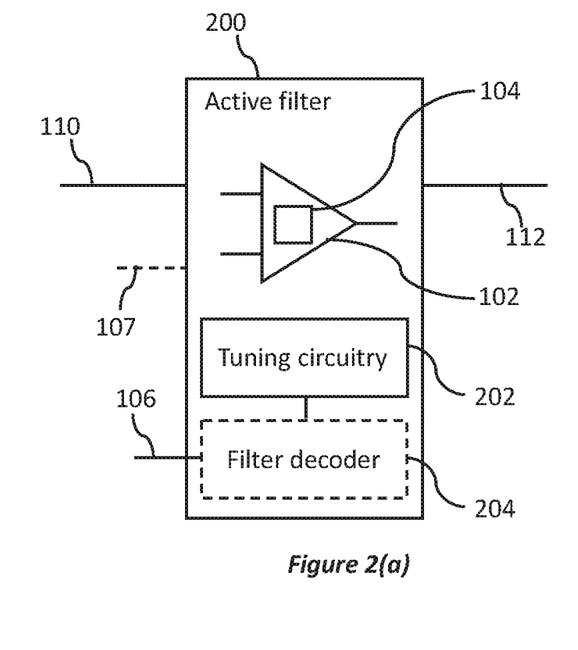
FIG. 2(a) is a schematic of an active filter in accordance with a second embodiment of the present disclosure.

FIG. 2(a) is a schematic of an active filter 200 in accordance with a second embodiment of the present disclosure. The active filter 200 is a specific embodiment of the active filter 100 as shown in FIG. 1(b), and compared to the filter 100 of FIG. 1(b), the active filter 200 further comprises tuning circuitry 202.

The tuning circuitry 202 is configured to receive the filter cutoff frequency setting and to set the cutoff frequency of the active filter based on the received filter cutoff frequency setting.

The tuning circuitry 202 may comprises one or more variable resistors, where the resistance of the one or more variable resistors is adjusted based on the received filter cutoff frequency setting, thereby setting the cutoff frequency of the active filter 200. At least one of the variable resistors may comprise a potentiometer or a rheostat.

The active filter 200 may comprise a filter decoder 204. In operation, the filter cutoff frequency setting is received by the tuning circuitry 202 via the filter decoder 204.

The filter decoder 204 is configured to convert the filter cutoff frequency setting into a suitable format for controlling the tuning circuitry 202 to set the cutoff frequency of the operational amplifier 102.

Figure 2B:
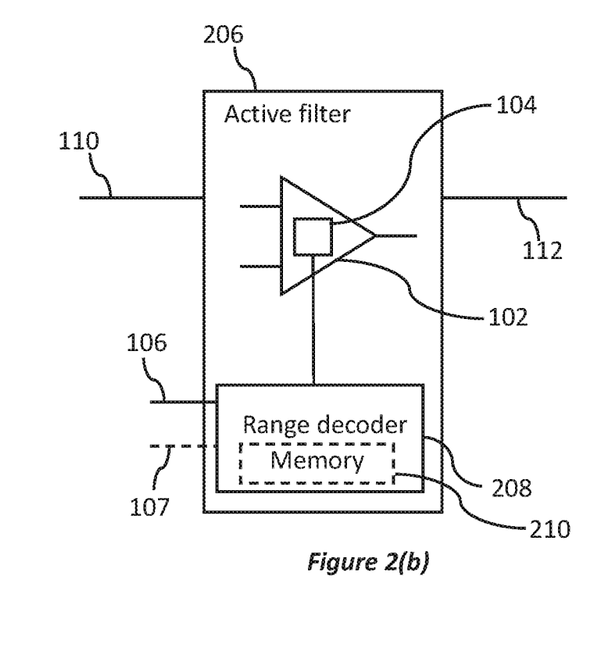
FIG. 2(b) is a schematic of an active filter in accordance with a third embodiment of the present disclosure.

FIG. 2(b) is a schematic of an active filter 206 in accordance with a third embodiment of the present disclosure. The active filter 206 is a specific embodiment of the active filter 100 as shown in FIG. 1(b), and compared to the filter 100 of FIG. 1(b), the active filter 206 further comprises a range decoder 208.

It will be appreciated that in a further embodiment, the active filter 206 may comprise the tuning circuitry 202 and/or the filter decoder 204 as described in relation to FIG. 2(a), and in accordance with the understanding of the skilled person.

The range decoder 208 is configured to receive the filter cutoff frequency setting and to generate the value to set the gain bandwidth product. The value is generated using the filter cutoff frequency setting.

In an alternative embodiment, range decoder 208 is configured to receive the noise performance setting and to generate the value to set the gain bandwidth product of the operational amplifier. The value is generated using the noise performance setting.

In a further embodiment, the range decoder 208 may be configured to receive the filter cutoff frequency setting and the noise performance setting, and to generate the value to set the gain bandwidth product of the operational amplifier, where the value is generated using both settings.

In any of the aforementioned embodiments, the range decoder 208 may be configured to generate the value to set the gain bandwidth product of the operational amplifier by selecting the value from a plurality of gain bandwidth product values. The value selected may be the minimum possible value from the plurality of gain bandwidth product values that meets one or both of the conditions provided by equations (1) and (2) as discussed previously.

The range decoder 208 may comprise a memory element 210. The plurality of gain bandwidth product values may be stored in the memory element 210 in a look up table format.

Figure 3A:
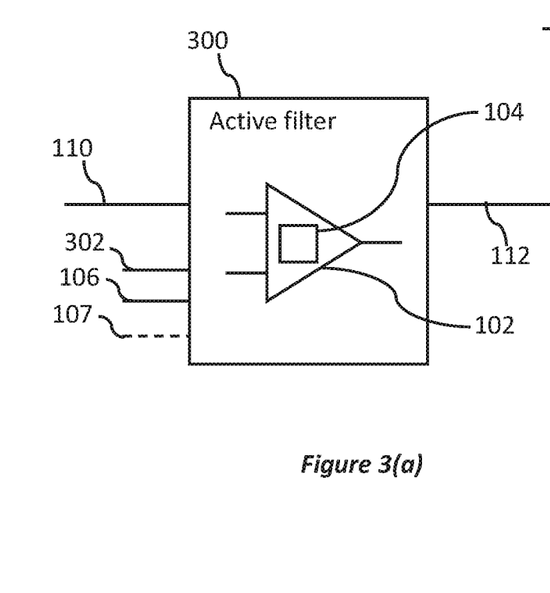
FIG. 3(a) is a schematic of an active filter in accordance with a fourth embodiment of the present disclosure.

FIG. 3(a) is a schematic of an active filter 300 in accordance with a fourth embodiment of the present disclosure. The active filter 300 is a specific embodiment of the active filter 100 as shown in FIG. 1(b). In the present embodiment, the controller is configured to control the bandwidth of the operational amplifier 102 based on a circuit setting 302, where the circuit setting 302 is a gain setting. The gain setting is used to set the gain of the operational amplifier 102.

The controller 104 may be configured to control the bandwidth of the operational amplifier 102 by setting the gain bandwidth product of the operational amplifier 102.

In a specific embodiment where the controller 104 is configured to control the bandwidth of the operational amplifier 102 based on the gain setting and the filter cutoff frequency setting, the controller 104 may be configured to set the gain bandwidth product to a value $GBW_{set}$ that is greater than or equal to the gain setting $Gain_{set}$ multiplied by the cutoff frequency setting $f\_cutoff_{set}$. This condition may be represented by the following equation:

$$\frac{GBW_{set}}{Gain_{set}} \geq f\_cutoff_{set} \quad (3)$$

Returning the example provided in relation to equation (1), consider the case where the gain setting is adjustable, and the filter 100 has a gain >1 V/V. The closed-loop bandwidth of the amplifier must then be considered when selecting the gain-bandwidth product setting ($GBW_{set}$) of the operational amplifier 102, as provided by equation (3).

In a further embodiment where the controller 104 is configured to control the bandwidth of the operational amplifier 102 based on the gain setting, the filter cutoff frequency setting and the noise performance setting, the controller 104 may be configured to set the gain bandwidth product to a value that meets both conditions as provided by equations (2) and (3).

In a further embodiment, where the controller 104 is configured to control the bandwidth of the operational amplifier 102 based on the gain setting and the noise performance setting, the controller 104 may be configured to set the gain bandwidth product to a value that meets the condition provided by equation (2) and the following condition:

$$\frac{GBW_{set}}{Gain_{set}} \geq f\_cutoff_{set} \quad (4)$$

where f_cutoff is the cutoff frequency of the filter 100.

Methods and apparatuses for a variable gain amplifier that adjust the open-loop bandwidth of the amplifier to keep the closed-loop bandwidth of PGA constant when changing gain are presented in U.S. Pat. No. 8,519,786. In this case the bandwidth is selected based on the gain setting only and not on a plurality of the input parameters.

Setting the bandwidth based on a plurality of parameters (for example the cutoff frequency and/or noise setting in addition to gain setting) provides a more informed method of controlling the bandwidth compared with the prior art. This can improve accuracy for systems where noise is a relevant factor and/or for systems where the cutoff frequency can be changed during operation.

Also, there are methods and apparatuses for transimpedance amplifiers (I-V converters) used in image sensors and other photodetectors that changes the gain of the amplifier to improve the quality of the output signal (U.S. Pat. Nos. 8,836,423 and 10,224,887) or optimize power consumption (U.S. Pat. No. 7,005,628) depending on different conditions.

In addition to the issues relating to bandwidth control by gain setting only as previously discussed, a further drawback of these apparatuses and methods includes the issue that the bandwidth control block produces the control output signal based on specific input or output signals (for example, readout signal from the pixel array as in U.S. Pat. No. 7,005,628) that cannot be used for efficient control of tunable active filter.

There is also an integrated circuit SLG47004 that includes digital rheostats, operational amplifiers with configurable bandwidth (gain-bandwidth product) and digital configurable cells. The amplifier's bandwidth setting can be changed during IC operation by changing the configuration registers with help of an external I²C master device, for example, a microcontroller. But SLG47004 itself can't change the internal amplifier's bandwidth on-the-fly. Furthermore, this only provides bandwidth control in a general way and is not specifically controlled by an input parameter such as a circuit setting.

Figure 3B:
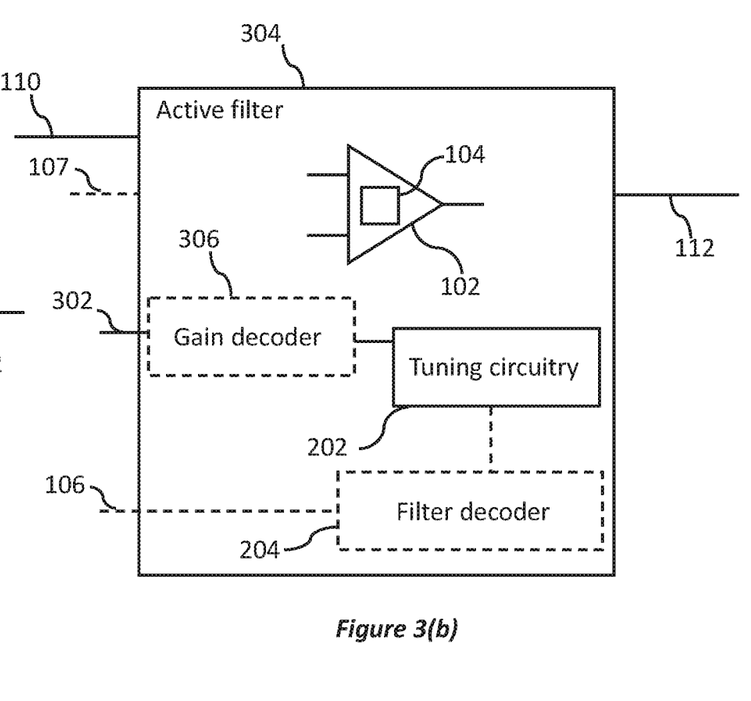
FIG. 3(b) is a schematic of an active filter in accordance with a fifth embodiment of the present disclosure.

FIG. 3(b) is a schematic of an active filter 304 in accordance with a fifth embodiment of the present disclosure. The active filter 304 shares features with the active filter 200 of FIG. 2(a).

In the present embodiment the tuning circuitry 202 is configured to receive the gain setting and to set the gain of the active filter 304 based on the received gain setting. The tuning circuitry 202 may comprise one or more variable resistors, where the resistance of the one or more variable resistors is adjusted based on the received gain setting, thereby setting the gain of the active filter 304. At least one of the variable resistors may be a variable feedback resistor. At least one of the variable resistors, which may be a variable feedback resistor, may comprise a potentiometer or a rheostat.

In an alternative embodiment, the tuning circuitry 202 may be configured to receive the filter cutoff frequency setting and to set the cutoff frequency of the active filter 304 based on the received cutoff frequency setting. The tuning circuitry 202 may comprise one or more variable resistors, where the resistance of the one or more variable resistors is adjusted based on the received cutoff frequency setting, thereby setting the cutoff frequency of the active filter 304. At least one of the variable resistors may comprise a potentiometer or a rheostat.

In a further embodiment, the tuning circuitry 202 may be configured to receive both the gain setting and the filter cutoff frequency setting, and to set the respective parameters.

The active filter 304 may further comprise the filter decoder 204 and/or a gain decoder 306. In operation the gain setting is received by the tuning circuitry 202 via the gain decoder 306. The gain decoder 306 is configured to converter the gain setting into a suitable format for controlling the tuning circuitry 202 for setting the gain of the active filter 206.

Figure 4:
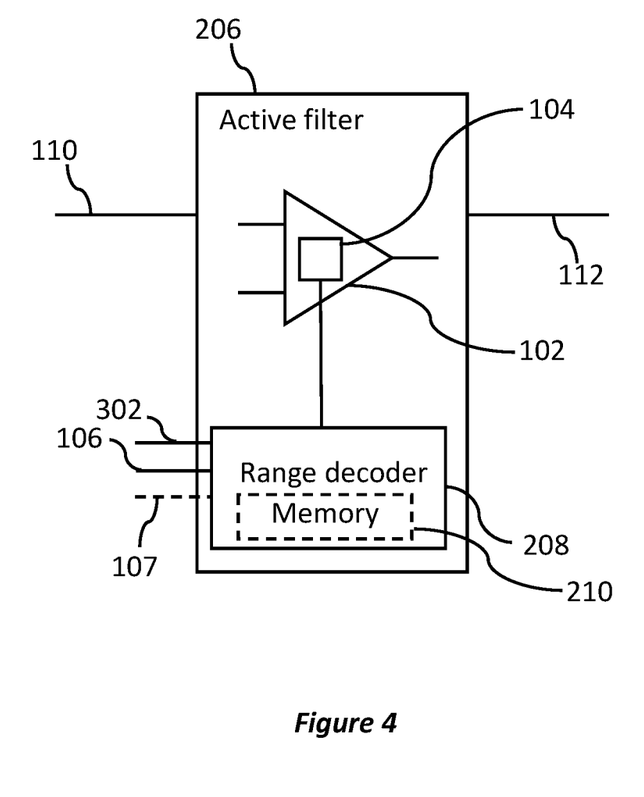
FIG. 4 is a schematic of an active filter in accordance with a sixth embodiment of the present disclosure.

FIG. 4 is a schematic of an active filter 400 in accordance with a sixth embodiment of the present disclosure. The active filter 400 shares features with the active filter 206 of FIG. 2(b).

In the present embodiment, the range decoder 208 is configured to receive the gain setting and receive one or both of the filter cutoff frequency setting and the noise performance setting. The range decoder 208 may then generate the value to set the gain bandwidth product using the gain setting and one or both of the filter cutoff frequency setting and the noise performance setting.

The range decoder 208 may be configured to select the minimum value from the gain bandwidth product values in accordance with equation (2) and in accordance with equation (4).

It will be appreciated that in a further embodiment, the active filter 400 may comprise the tuning circuitry 202 and/or the filter decoder 204 and/or the gain decoder 306 as described in relation to FIG. 3(a), and in accordance with the understanding of the skilled person.

Consider a specific embodiment where the range decoder 208 comprises the memory element 210 and the plurality of gain bandwidth product values are stored in the memory element 210 in a look up table format.

In this example, there may be N possible bandwidth settings stored in the look up table corresponding to N gain bandwidth product values. In operation, the range decoder block 208 selects the minimal discrete bandwidth setting (gain-bandwidth product) from the discrete N range that also meets one or more additional conditions, which will be described further below. The selection of the minimal discrete bandwidth setting be described by the following condition:

$$GBW_{need} \rightarrow \min_{N}\{GBW_0, GBW_1, \ldots, GBW_N\} \quad (5)$$

where $GBW_{need}$ is minimum gain bandwidth product setting from a set of options. N is a number of gain bandwidth options in the look up table. As one or more additional conditions also have to be met the $GBW_{need}$ value selected may not be equal to $GBW_0$, but should be the minimum value that still meets the additional one or more conditions.

The condition represented by equation (5) should be met alongside one or more of the conditions as discussed herein, with other conditions being possible based on the understanding of the skilled person. The condition may, for example, be provided by one of
Equations (1) and/or (2)
Equation (3)
Equations (2) and (3)
Equations (2) and (3)

In these cases, the gain bandwidth product value $GBW_{set}$ as described by the above equations corresponds to the $GBW_N$ as provided in the look up table that also meets the condition provided by equation (5).

Figure 5:
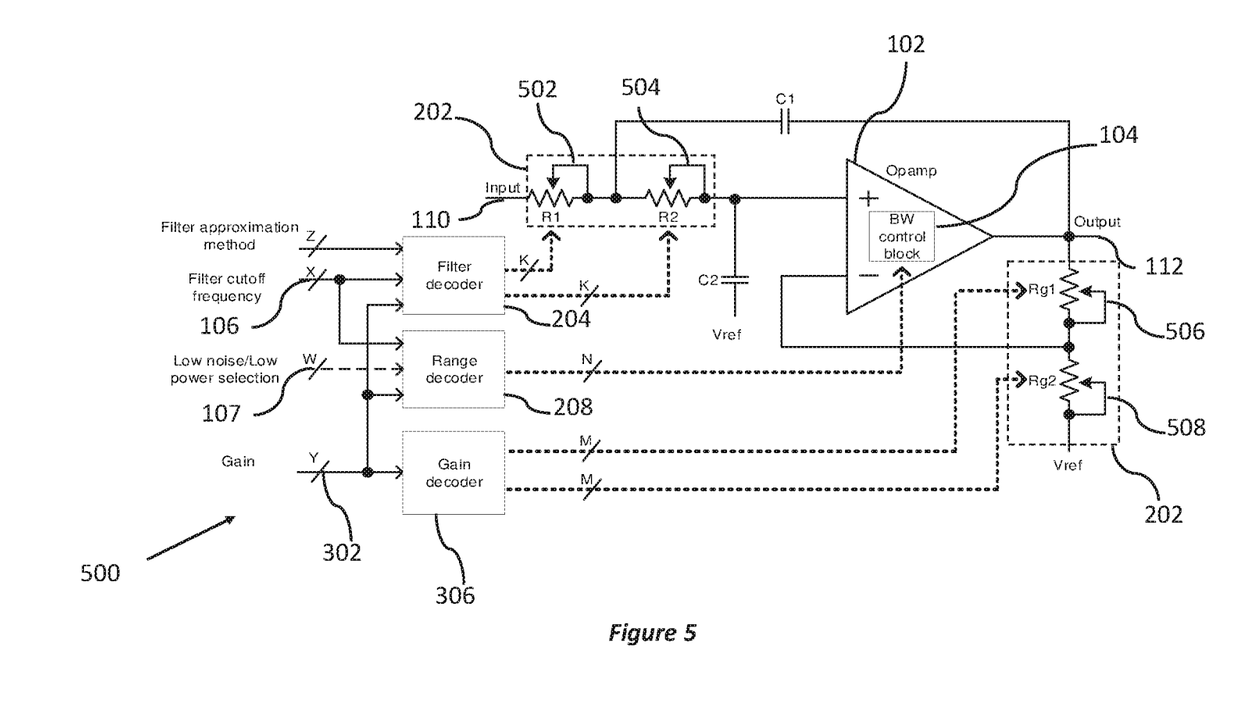
FIG. 5 is a schematic of an active filter in accordance with a seventh embodiment of the present disclosure.

FIG. 5 is a schematic of an active filter 500 in accordance with a seventh embodiment of the present disclosure. In the present embodiment, the active filter 500 has a Sallen-Key topology. In the present embodiment, the active filter 500 is a Sallen-Key tunable active filter with on-the-fly amplifier bandwidth control.

In the present embodiment the tuning circuitry 202 comprises two variable resistors 502, 504 for setting the filter cutoff frequency, and comprises two variable resistors 506, 508 for setting the gain. One or more of the variable resistors 502, 504, 506, 508 may be digital potentiometers or rheostats.

The active filter 500 further comprises capacitors C1, C2 and is coupled to a reference voltage Vref.

The cut-off frequency of the filter 500 from the discrete range X, the gain from discrete range Y, the filter approximation method from the discrete range Z (Butterworth, Chebyshev, Elliptic, etc.) and the noise performance from the discrete range W can be changed on-the-fly by altering the digital potentiometers/rheostats values and gain-bandwidth product of the opamp 102. Filter approximation methods are methods that allow the filter to be synthesized for a real-world application, since an ideal "brick wall" filter is not physically achievable.

The filter approximation method should be chosen depending on the target application, since different filter approximation methods result in different filter characteristics (bandwidth ripple, step response, phase delay, etc.).

In the case of the filter 500 that comprises the amplifier 102, digital potentiometers (corresponding to the resistors 502, 504, 506, 508), and passive capacitors (C1, C2), the filter cutoff frequency depends on the digital potentiometer/rheostat values (code) and the gain of the opamp 102.

Also, the filter approximation method (Butterworth, Chebyshev, Elliptic, etc.) depends on digital potentiometer/rheostat values (code) and the gain of the opamp 102.

Eventually, the filters tuned to the same cutoff frequency can have different potentiometer/rheostat values depending on the gain and the selected filter approximation method (for example as shown in Microchip Technology Inc., "Using Digital Potentiometers to Design Low-Pass Adjustable Filters", AN737 application note, 2004). The range decoder block 208 of the present example allows selection of the amplifier bandwidths depending on discrete selectable filter cutoff frequency, discrete selectable gain, and selectable noise mode.

Consider an example where the bandwidth control settings are as illustrated in Table 1:

TABLE 1

Bandwidth control settings

| Discrete opamp bandwidth setting (GBWP), MHz | Code |
|---|---|
| 2.5 | 00b |
| 5 | 01b |
| 10 | 10b |
| 20 | 11b |

In operation, the controller 104 sets the gain bandwidth product of the operational amplifier 102 based on the associated code value as received from the range decoder 208. For example, if the range decoder 208 provides the conde 00b, then the controller 104 sets the gain bandwidth product to 2.5. Table 2 shows noise parameters:

TABLE 2

Noise parameters

| Discrete opamp bandwidth setting (GBWP), MHz | Input Voltage Noise Density, nV/√(Hz) | RMS Noise* (Gain x1.1), μV | RMS Noise* (Gain x2.0), μV |
|---|---|---|---|
| 2.5 | 50 | 156 | 283 |
| 5 | 40 | 124 | 226 |
| 10 | 30 | 93 | 170 |
| 20 | 20 | 62 | 113 |

Table 3 shows range decoder 208 settings, illustrating an example look up table as may be stored in the range decoder 208.

TABLE 3

The example of the range decoder configuration

| Filter cutoff frequency, MHz | Gain, V/V | Theoretical opamp minimal GBWP, MHz | Discrete opamp bandwidth setting (GBWP), MHz | Range decoder output | Noise 'Low power/High performance' modes*, uV |
|---|---|---|---|---|---|
| 1 | 1.1 | 1.1 | 2.5 | 00b | 156/62 |
|   | 2   | 2   | 2.5 | 00b | 283/113 |
| 2 | 1.1 | 2.2 | 2.5 | 00b | 156/62 |
|   | 2   | 4   | 5   | 01b | 226/113 |
| 4 | 1.1 | 4.4 | 5   | 01b | 124/62 |
|   | 2   | 8   | 10  | 10b | 170/113 |
| 6 | 1.1 | 6.6 | 10  | 10b | 93/62 |
|   | 2   | 12  | 20  | 11b | 113/113 |
| 8 | 1.1 | 8.8 | 10  | 10b | 93/62 |
|   | 2   | 16  | 20  | 11b | 113/113 |

*White noise (RMS) of the opamp over 8 MHz bandwidth was used to simplify the calculations.

Table 3 shows the range decoder settings, filled in accordingly to equations (3) and (5). Also, Table 3 shows the noise level for 'Low power' and 'High performance' modes. The 'RMS Noise' in Table 3 is the white noise of the opamp calculated for the 8 MHz bandwidth.

The range decoder inputs are gain setting, filter cutoff frequency setting, and 'Low power/High performance' mode selection as illustrated in FIG. 5. In the present example, the gain setting has two options: 1.1 V/V and 2V/V (1 bit). The filter cutoff frequency setting has five options: 1 MHz, 2 MHz, 4 MHz, 6 MHz, 8 MHz (3 bit). The output of the range decoder has four options: 2.5 MHz, 5 MHz, 10 MHz, 20 MHz (2 bit).

In the case of ADC Vref=1.5 V, the 1 LSB is 5860 V for the 8-bit mode and 92 V for the 14-bit mode. 8-bit ADC mode is suitable for the active filter 'Low power mode'. But 14-bit ADC mode must be used with active filter 'High performance mode'. Also, additional averaging can be applied to the signal to filter out the white noise if high ADC resolution is used.

For a tunable active filter, the main parameter of the filter (the cutoff frequency) can be changed. For example, in the case of a low pass filter with the cutoff frequency options 100 kHz, 1 MHz, and 10 MHz it's possible to switch between one of these three options. If the user selects 1 MHz, the low-pass filter will pass the signals from DC to 1 MHz without attenuation and will reduce the signals higher than 1 MHz. The cutoff frequency setting is one of the input parameters of the tunable active filter.

In summary, a tunable active filter typically comprises a traditional opamp with a fixed gain-bandwidth product and other active components (for example, digital potentiometers). The cutoff frequency of the filter can be changed. Therefore, the filter typically has the control inputs to select the filter cutoff frequency (cutoff frequency setting).

Active filters that are not tunable are usually constructed to operate with a fixed cutoff frequency. Active filters typically comprise passive components and a traditional opamp which has a gain-bandwidth product that cannot be changed and has no control inputs.

In specific embodiments, the present disclosure provides a tunable active filter based on the opamp with a selectable gain-bandwidth product and comprising a specialized opamp and other active components. The cutoff frequency of the filter can be changed. Such a filter has the control inputs to select the filter cutoff frequency (cutoff frequency setting).

In addition to this, the gain-bandwidth product of the opamp can be changed. That is why the opamp has control inputs to select "speed" (gain-bandwidth product setting). These inputs may be controlled by the user or with some embedded circuits.

Furthermore, a specific embodiment of the present disclosure uses an opamp with the selectable bandwidth setting (gain-bandwidth product).

It will be appreciated that 'cutoff frequency' can be applied either to the active filter (to the frequency response of the filter) or to the opamp (the bandwidth characteristic of the opamp). In the present disclosure we primarily refer to the cutoff frequency of the active filter rather than the opamp. It will be appreciated that term 'bandwidth' can also be applied to the active filter or the opamp.

Figure 6A:
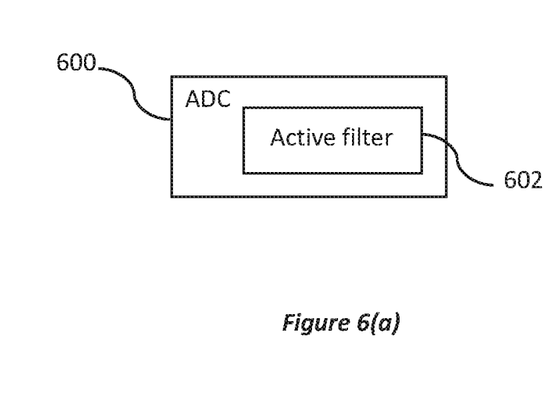
FIG. 6(a) is a schematic of an apparatus in accordance with an eighth embodiment of the present disclosure.

FIG. 6(a) is a schematic of an apparatus 600 comprising an active filter 602 in accordance with an eighth embodiment of the present disclosure. The active filter 602 may be any of the active filters as disclosed herein.

In the present embodiment, the apparatus 600 is an analog to digital converter (ADC). In further embodiments, the apparatus may be an amplifier, such as a programmable gain amplifier (PGA) or an ADC driver.

The active filter 602 may be configured to operate in a high performance mode when the noise performance setting is less than a threshold value and/or to operate in a low power mode when the noise performance setting is greater than or equal to a threshold value. The current consumed by an active filter in high performance mode is higher than the current consumed by an active filter in low power mode.

The noise selection feature is useful for the data acquisition systems with ADC that can sample the signal at a different resolution. In a specific embodiment it is possible to implement at least two power modes for such systems:

Low power mode. High precision is not required. The ADC is used in low-resolution mode (6, 8, 10 bits) and consumes less power to perform sampling/conversion. Because the resolution of the ADC is low, the active filter can be switched to a low power mode. The op-amp noise is high, but this is acceptable since the resolution of the ADC is low.

High performance mode. ADC is used in high-resolution mode (14, 16 . . . bit) and consumes more power to perform sample/conversion. An active filter should be switched to 'High performance' mode to provide the minimum amount of output noise. The power consumption of both AD C and active filter is high.

High performance mode can also be used when measuring low amplitude signals to minimize the impact of noise. For example, in the case of data acquisition system that contains several analog inputs, analog MUX, analog filter, and ADC, low amplitude signals like current signal (voltage drop across the shunt resistor) can be measured using high performance mode. High voltage signals (for example, bus voltage) can be measured using low power mode to minimize device power consumption.

Figure 6B:
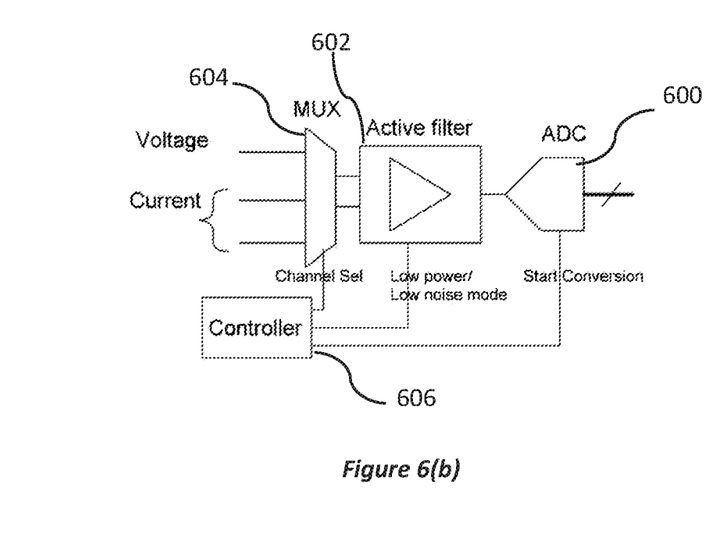
FIG. 6(b) is a schematic of an alternative embodiment of the apparatus of FIG. 6(b)

FIG. 6(b) is a schematic of an alternative embodiment, illustrating the ADC 600 and the active filter 602 as separate components. The apparatus of FIG. 6(b) further comprises a MUX 604 and a controller 606.

Figure 7:
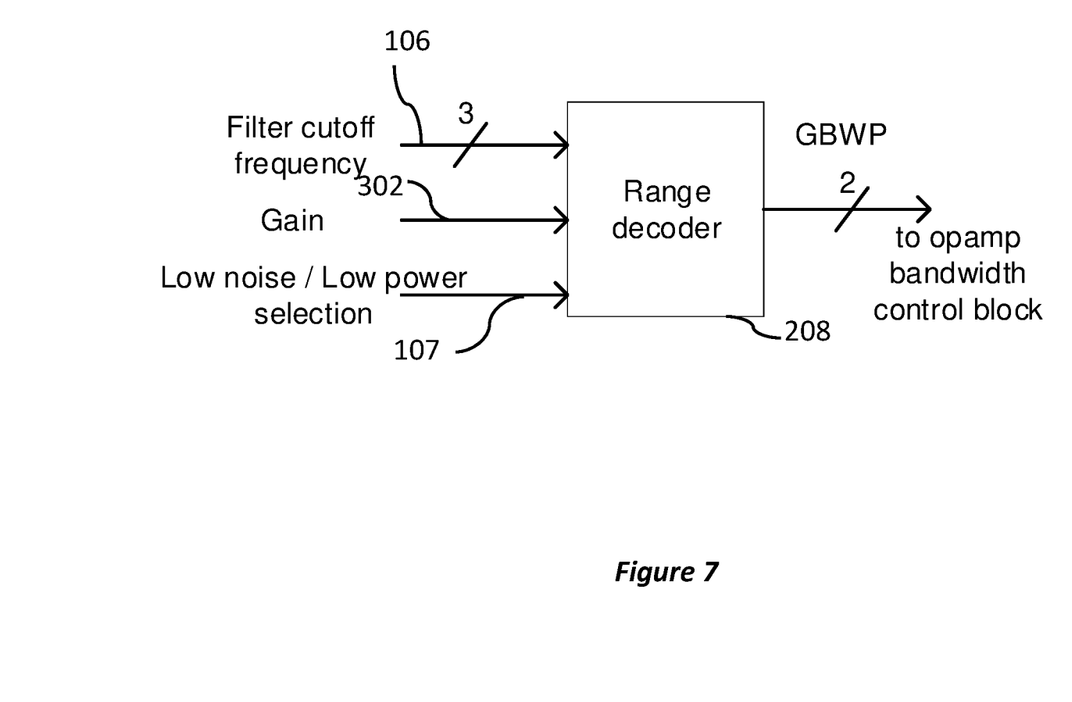
FIG. 7 is an alternative schematic of the range decoder as shown in FIG. 5.
Figure 8:
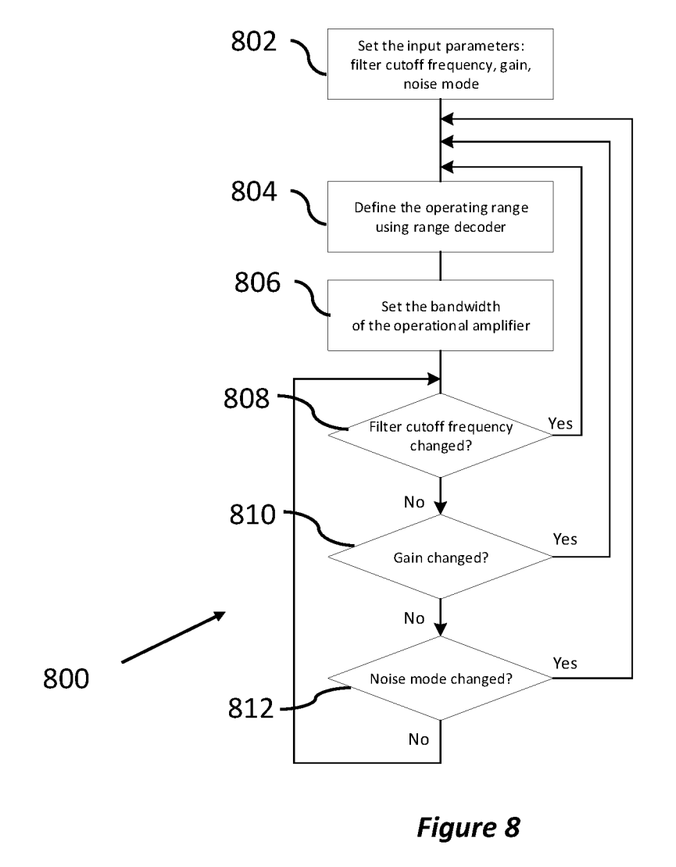
FIG. 8 is a flow chart of the operation of the range decoder.

FIG. 7 is an alternative schematic of the range decoder 208 as shown in FIG. 5. FIG. 8 is a flow chart 800 of the operation of the range decoder 208 and summarises an "On-the-fly Current Consumption Control Method".

At a step 802, input parameters, for example comprising the filter cutoff frequency setting, gain setting and the noise performance setting are received by the range decoder 208.

At a step 804, the range decoder 208 functions to determine the suitable value for the gain bandwidth product, to set the bandwidth.

At a step 806, the gain bandwidth product value is used to set the opamp bandwidth.

At steps 808, 810, 812 there is a sequence in which changes to the filter cutoff frequency setting, the gain setting and the noise performance are evaluated, with a return to step 804 if any changes are detected. Otherwise, the steps 808, 810, 812 are repeated until a change is detected.

In summary, the method is as follows: the input control signals of filter cutoff frequency, the gain of the filter and the noise mode selection come to the range decoder 208. The range decoder 208 defines the discrete bandwidth setting. Then the discrete signal from the output of the range decoder block comes to the input of the bandwidth control block 104. Then the bandwidth control block sets the bandwidth of the amplifier 102 depending on the input signal (the output of the range decoder).

Figure 9:
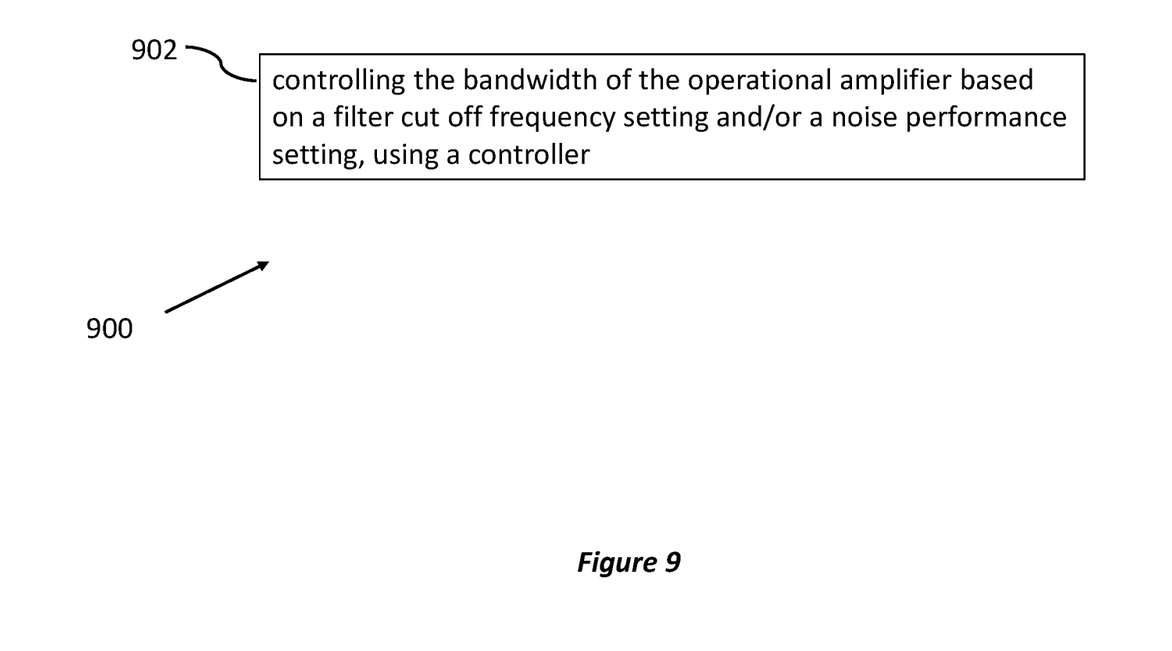
FIG. 9 is a flow chart of a method controlling an active filter comprising an operational amplifier.

FIG. 9 is a flow chart of a method 900 controlling an active filter comprising an operational amplifier. The method 900 comprises controlling the bandwidth of the operational amplifier based on a cutoff frequency setting and/or a noise performance setting, using a controller, at a step 902.

The present disclosure may apply to tuneable active filters and be used to automatically adjust the bandwidth of an electronic amplifier of the active filter based on the filter cutoff frequency, the noise performance and/or the gain.

Embodiments of the present disclosure use a new range decoder block that selects the operational amplifier bandwidth (gain-bandwidth product, GBWP) depending on the plurality of the input signals (cut-off frequency and/or noise performance and optionally gain). This block allows significant reduction in the power consumption of the active filter when operating in a low cut-off frequency range.

Common reference numerals and variables between Figures represent common features.

Various improvements and modifications may be made to the above without departing from the scope of the disclosure.

The invention claimed is:

1. An active filter comprising:
an operational amplifier;
a range decoder; and
a controller,
wherein the controller is configured to:
control a bandwidth of the operational amplifier based on a filter cutoff frequency setting and/or a noise performance setting by setting its gain bandwidth product;
set the gain bandwidth product of the operational amplifier to a value:
i) that is greater than or equal to a gain of the operational amplifier multiplied by the filter cutoff frequency setting; and/or
ii) that provides a noise performance of the operational amplifier that is less than the noise performance setting, and
wherein the range decoder is configured to:
receive the filter cutoff frequency setting and/or the noise performance setting; and
generate the value to set the gain bandwidth product of the operational amplifier, the value being generated using the filter cutoff frequency setting and/or the noise performance setting.

2. The active filter of claim 1 comprising tuning circuitry configured to receive the filter cutoff frequency setting and to set the cutoff frequency of the active filter based on the received filter cutoff frequency setting.

3. The active filter of claim 2, wherein:
the tuning circuitry comprises one or more variable resistors; and the resistance of the one or more variable resistors is adjusted based on the received filter cutoff frequency setting, thereby setting the cutoff frequency of the active filter.

4. The active filter of claim 2 comprising a filter decoder, wherein the filter cutoff frequency setting is received by the tuning circuitry via the filter decoder, the filter decoder being configured to convert the frequency setting into a suitable format for controlling the tuning circuitry.

5. The active filter of claim 1, wherein the range decoder is configured to generate the value to set the gain bandwidth product of the operational amplifier by selecting the value from a plurality of gain bandwidth product values.

6. The active filter of claim 5, wherein the range decoder comprises a memory element, the plurality of gain bandwidth product values been stored in the memory element in a look up table format.

7. The active filter of claim 1, wherein the controller is configured to control the bandwidth of the operational amplifier based on a gain setting.

8. The active filter of claim 7 comprising tuning circuitry configured to:
receive the filter cutoff frequency setting and to set the cutoff frequency of the active filter based on the received filter cutoff frequency setting; and/or
receive the gain setting and to set the gain of the active filter based on the received gain setting.

9. The active filter of claim 8, wherein:
the tuning circuitry comprises one or more variable resistors;
the resistance of the one or more variable resistors is adjusted based on:
  i) the received filter cutoff frequency setting, thereby setting the cutoff frequency of the active filter; and/or
  ii) the received gain setting, thereby setting the gain of the active filter.

10. The active filter of claim 8 comprising:
a filter decoder, wherein the filter cutoff frequency setting is received by the tuning circuitry via the filter decoder, the filter decoder being configured to convert the frequency setting into a suitable format for controlling the tuning circuitry; and/or
a gain decoder, wherein the gain setting is received by the tuning circuitry via the gain decoder, the gain decoder being configured to converter the gain setting into a suitable format for controlling the tuning circuitry.

11. The active filter of claim 7, wherein the controller is configured to control the bandwidth of the operational amplifier by setting its gain bandwidth product.

12. The active filter of claim 11, wherein the controller is configured to set the gain bandwidth product of the operational amplifier to a value:
that is greater than or equal to the gain setting multiplied by the filter cutoff frequency setting and/or
that provides a noise performance of the operational amplifier that is less than the noise performance setting.

13. The active filter of claim 12, comprising a range decoder wherein the range decoder is configured to:
receive the gain setting;
receive the filter cutoff frequency setting and/or the noise performance setting; and
generate the value to set the gain bandwidth product of the operational amplifier, the value being generated using the gain setting and one or both of the filter cutoff frequency setting and the noise performance setting.

14. The active filter of claim 13, wherein the range decoder is configured to generate the value to set the gain bandwidth product of the operational amplifier by selecting the value from a plurality of gain bandwidth product values.

15. A method of controlling an active filter comprising an operational amplifier, a controller, and a range decoder, the method comprising:
controlling a bandwidth of the operational amplifier based on a filter cutoff frequency setting and/or a noise performance setting by setting its gain bandwidth product, using the controller;
setting the gain bandwidth product of the operational amplifier, using the controller, to a value:
  i) that is greater than or equal to a gain of the operational amplifier multiplied by the filter cutoff frequency setting; and/or
  ii) that provides a noise performance of the operational amplifier that is less than the noise performance setting;
receiving the filter cutoff frequency setting and/or the noise performance setting at the range decoder; and
generating the value to set the gain bandwidth product of the operational amplifier, using the range decoder, the value being generated using the filter cutoff frequency setting and/or the noise performance setting.

16. An apparatus being an amplifier or an analog to digital converter, the apparatus comprising an active filter comprising:
an operational amplifier;
a range decoder; and
a controller,
wherein the controller is configured to:
  control a bandwidth of the operational amplifier based on a filter cutoff frequency setting and/or a noise performance setting by setting its gain bandwidth product;
  set the gain bandwidth product of the operational amplifier to a value:
    i) that is greater than or equal to a gain of the operational amplifier multiplied by the filter cutoff frequency setting; and/or
    ii) that provides a noise performance of the operational amplifier that is less than the noise performance setting, and
wherein the range decoder is configured to:
  receive the filter cutoff frequency setting and/or the noise performance setting; and
  generate the value to set the gain bandwidth product of the operational amplifier, the value being generated using the filter cutoff frequency setting and/or the noise performance setting.

17. The apparatus of claim 16, being an analog to digital converter configured:
  i) to operate in a high performance mode when the noise performance setting is less than a threshold value; and/or
  ii) to operate in a low power mode when the noise performance setting is greater than or equal to a threshold value.

* * * * *